(12) United States Patent
Dai et al.

(10) Patent No.: US 8,581,174 B2
(45) Date of Patent: Nov. 12, 2013

(54) IMAGE SENSOR WITH PRISMATIC DE-MULTIPLEXING

(75) Inventors: Tiejun Dai, Santa Clara, CA (US); Ching Hu, Los Altos, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 390 days.

(21) Appl. No.: 12/198,796

(22) Filed: Aug. 26, 2008

(65) Prior Publication Data

US 2010/0051785 A1    Mar. 4, 2010

(51) Int. Cl.
  *H01J 5/16* (2006.01)
  *H01L 27/00* (2006.01)
  *H04N 9/07* (2006.01)

(52) U.S. Cl.
  USPC .................. 250/226; 250/208.1; 348/337

(58) Field of Classification Search
  USPC .............. 250/226, 208.1, 216, 239; 257/257, 257/258, 290, 291, 294, 440; 348/272, 273, 348/276–281, 294, 302, 337, 336, 338; 359/831, 833, 837
  See application file for complete search history.

(56) References Cited

U.S. PATENT DOCUMENTS

| | | | |
|---|---|---|---|
| 3,971,065 A | 7/1976 | Bayer | |
| 4,882,619 A * | 11/1989 | Hasegawa et al. | 348/337 |
| 4,957,371 A * | 9/1990 | Pellicori et al. | 356/419 |
| 5,696,610 A * | 12/1997 | Imoto | 358/509 |
| 5,760,834 A * | 6/1998 | Rostoker | 348/340 |
| 6,104,446 A * | 8/2000 | Blankenbecler et al. | 349/5 |
| 6,330,113 B1 | 12/2001 | Slagle et al. | |
| 6,404,598 B1 | 6/2002 | Nayak et al. | |
| 6,404,958 B1 | 6/2002 | Boye et al. | |
| 6,984,812 B2 * | 1/2006 | McCaffrey et al. | 250/208.1 |
| 7,153,720 B2 * | 12/2006 | Augusto | 438/69 |
| 7,176,446 B1 * | 2/2007 | Wiedemann | 250/226 |
| 7,358,475 B2 * | 4/2008 | Tanaka et al. | 250/208.1 |
| 2003/0063204 A1 * | 4/2003 | Suda | 348/272 |
| 2006/0044429 A1 * | 3/2006 | Toda et al. | 348/272 |
| 2007/0159542 A1 | 7/2007 | Luo | |

FOREIGN PATENT DOCUMENTS

| | | | | |
|---|---|---|---|---|
| JP | 08-182006 A | | 7/1996 | |
| JP | 08182006 A | * | 7/1996 | ............... H04N 9/07 |
| KR | 2007075567 | * | 7/2007 | |

OTHER PUBLICATIONS

Compton et al., *Color Filter Array 2.0—Interview with John Compton and John Hamilton* http://johncompton.pluggedin.kodak.com/; Jun. 14, 2007, pp. 1-5 (last visited Aug. 26, 2008).

Lyon et al., *Eyeing the Camera: into the Next Century*; http://www.foveon.com/files/CIC10_Lyon_Hubel_Final.pdf; (last visited Aug. 26, 2008).

(Continued)

*Primary Examiner* — Que T Le
*Assistant Examiner* — Jennifer Bennett
(74) *Attorney, Agent, or Firm* — Blakely Sokoloff Taylor & Zafman LLP

(57) ABSTRACT

An image sensor includes a first imaging pixel for a first color having a photosensitive region disposed within a substrate of the image sensor and a second imaging pixel for a second color that is different from the first color having a photosensitive region disposed within the substrate. A refraction element disposed adjacent to the substrate, so that the refraction element refracts light of the first color to the photosensitive region of the first imaging pixel and refracts light of the second color to the photosensitive region of the second imaging pixel.

14 Claims, 5 Drawing Sheets

(56) References Cited

OTHER PUBLICATIONS

"Introduction to DWDM Technology", Text Part No. OL-0884-01, Cisco Systems, Inc., Jun. 4, 2001, pp. 1-66.

Kartalopoulos, S.V., "Introduction to DWDM Technology: Data in a Rainbow," SPIE Optical Engineering Press/IEEE Press, Piscataway, NJ, 2000, pp. 92-93.

* cited by examiner

IMAGE SENSOR WITH PRISMATIC DE-MULTIPLEXING

TECHNICAL FIELD

This disclosure relates generally to imaging sensors, and in particular but not exclusively, relates to imaging sensors having refraction elements.

BACKGROUND INFORMATION

Integrated circuits have been developed to reduce the size of components used to implement circuitry. For example, integrated circuits have been using ever-smaller design features, which reduces the area used to implement the circuitry, such that design features are now well under the wavelengths of visible light. With the ever-decreasing sizes of image sensors and the individual pixels that are part of a sensing array, it is important to more efficiently capture charges that are formed when incident light illuminates the sensing array. Thus, more efficiently capturing photonically generated charges helps to maintain or improve the quality of electronic images captured by the sensing arrays of ever-decreasing sizes.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an image sensor with prismatic de-multiplexing are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. The term "or" as used herein is normally meant to encompass a meaning of an inclusive function, such as "and/or."

Throughout this specification, several terms of art are used. These terms are to take on their ordinary meaning in the art from which they come, unless specifically defined herein or the context of their use would clearly suggest otherwise. "Quantum efficiency" is defined herein as the ratio of the number of carriers generated to the number of photons incident upon an active region of an imaging sensor. "Color" is defined herein as light that having a certain wavelength or having a range of wavelengths. For example, different colors of light can be red, blue, or green, with each color containing a range of wavelengths of light that is different from other named colors. The frequencies and ranges of wavelengths include invisible wavelengths of light as well.

Figure 1:
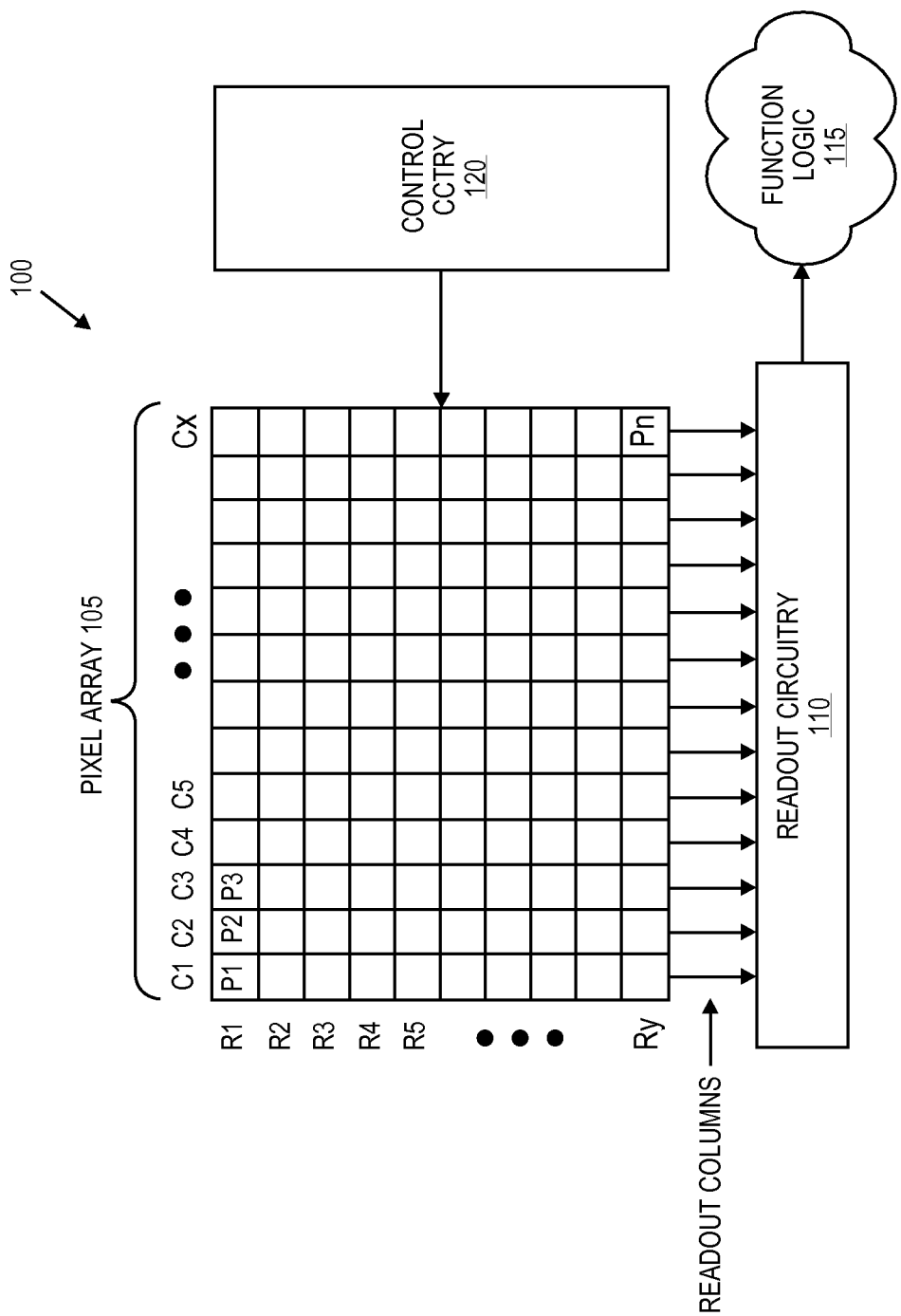
FIG. 1 is a block diagram illustrating a backside illuminated imaging sensor, in accordance with an embodiment of the invention.

FIG. 1 is a block diagram illustrating a backside illuminated imaging sensor 100, in accordance with an embodiment of the invention. While a backside illuminated imaging sensor with prismatic de-multiplexing is disclosed herein, embodiments of the present invention can be practiced using front side illuminated imaging sensors. The illustrated embodiment of imaging sensor 100 includes a pixel array 105, readout circuitry 110, function logic 115, and control circuitry 120.

Pixel array 105 is a two-dimensional ("2D") array of backside illuminated imaging pixels (e.g., pixels P1, P2 . . . , Pn). In one embodiment, each pixel is an active pixel sensor ("APS"), such as a complementary metal-oxide-semiconductor ("CMOS") imaging pixel. Each pixel typically has a photosensitive region, such as a photodiode region, that is used to collect charge that is generated by light shining on the pixel. When light of different color is refracted into different adjacent pixels (such as described below with respect to FIGS. 2 and 3), the adjacent pixels can be considered to "subpixels" because the subpixels can be combined (using an additive color table, for example) to produce a single display pixel. As illustrated, each pixel is arranged into a row (e.g., rows R1 to Ry) and a column (e.g., column C1 to Cx) to acquire image data of a person, place, or object, which can then be used to render a 2D image of the person, place, or object. Each pixel can comprise subpixel triplets for different colors, as illustrated in FIG. 4.

After each pixel has acquired its image data or image charge, the image data is readout by readout circuitry 110 and transferred to function logic 115. Readout circuitry 110 may include amplification circuitry, analog-to-digital conversion circuitry, or otherwise. Function logic 115 may simply storage the image data or even manipulate the image data by applying post image effects (e.g., crop, rotate, remove red eye, adjust brightness, adjust contrast, or otherwise). In one embodiment, readout circuitry 110 may readout a row of image data at a time along readout column lines (illustrated) or may readout the image data using a variety of other techniques (not illustrated), such as a serial readout or a full parallel readout of all pixels simultaneously.

Control circuitry 120 is coupled to pixel array 105 to control operational characteristic of pixel array 105. For example, control circuitry 120 may generate a shutter signal for controlling image acquisition.

In one embodiment, a color pattern (e.g. a Bayer pattern) and image processing may be used to reconstruct the RGB colors for each pixel.

In another embodiment, a plurality of separate image sensors may be used to determine the RGB colors for an individual pixel by combining the image of the same pixel from each sensor to reconstruct the RGB colors for the individual pixel.

Figure 2:
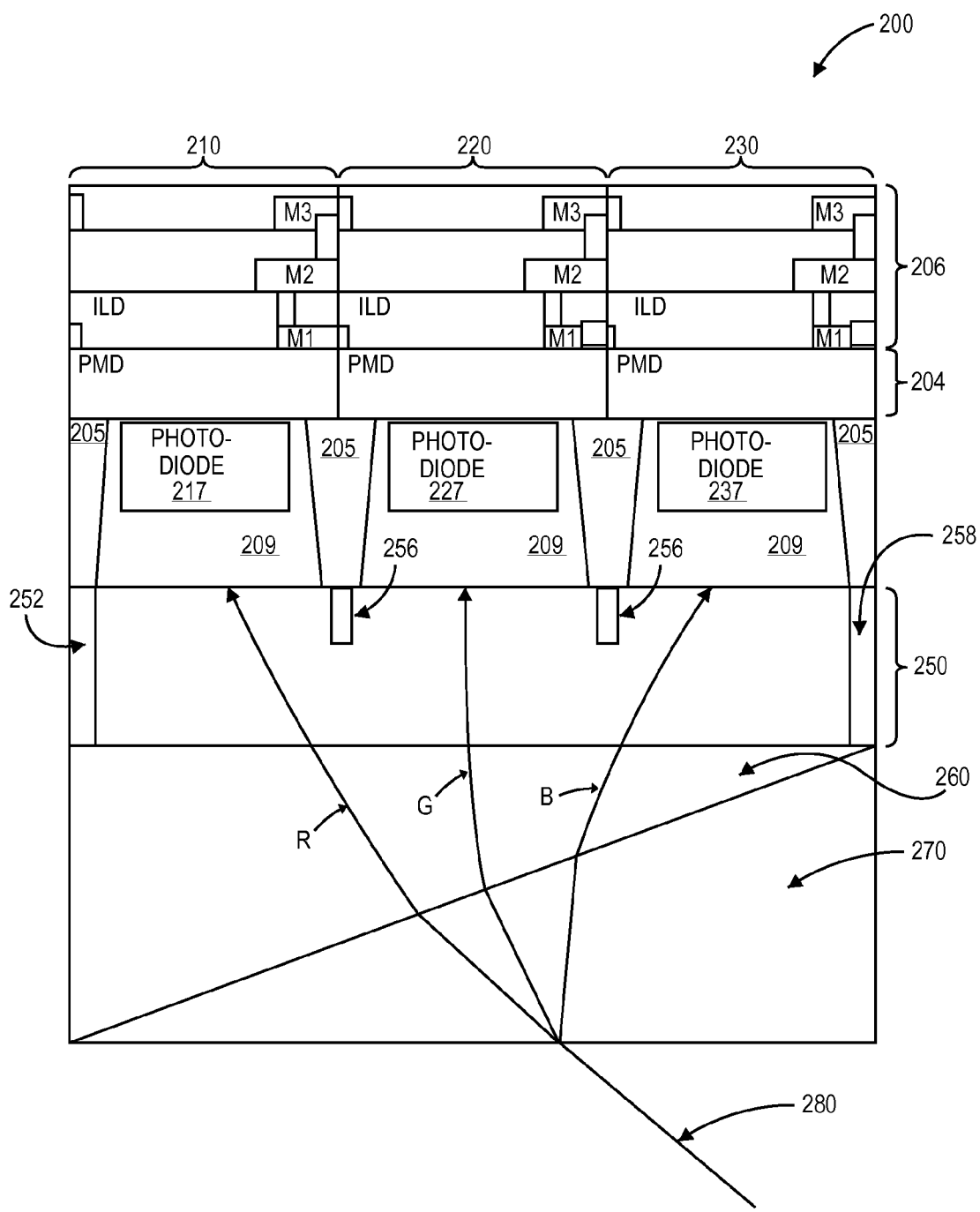
FIG. 2 is an illustration of a cross-section of a sample sensor array of backside illuminated (BSI) pixel of an image sensor.

FIG. 2 is an illustration of a cross-section of a sample sensor array of backside illuminated (BSI) pixel of an image sensor. Array 200 includes (sub-) pixels 210, 220, and 230. Array 200 typically contains at least thousands of pixels and often contains more than a million pixels. Three pixels (or "subpixels" as discussed above) are shown for the purpose of clarity. Each pixel is formed using substrate 209 and can be separated from other pixels by, for example, a shallow-trench isolation (STI) structure 205.

Each pixel includes metallization layers (for electrical connectivity for each pixel) that are formed in interlayer dielectric layers 206. Interlayer dielectric layers 206 can include, for example, three layers of metallization (layers M1, M2, and M3) formed within the interlayer dielectric layers 206. A primary dielectric layer 204 is formed over photodiode regions 217, 227, and 237 of each pixel. The photodiode regions 217, 227, and 237 can be formed using front side or backside processing.

Separation layer 250 can be a substrate upon which array 200 is disposed. Alternatively, separation layer 250 can be formed under a substrate 209 and isolation regions 205. The thickness of separation layer 250 can be selected to allow refraction of, for example, backside-illuminated red light into photodiode region 217, green light into photodiode region 227, and blue light into photodiode region 237.

Refraction element 270 is disposed under layer 260. Refraction element 270 is typically made of a high index of refraction (such as an index of refraction that is greater than 2.0). Refraction element 270 can be a prism, "super-prism," diffraction grating, a portion (e.g., "tooth") of a Fresnel lens, and the like. Where refraction element 270 is a Fresnel lens, for example, each tooth of the lens can underlie a plurality of photosensitive areas for receiving light of different color. The plurality of photosensitive areas can be, for example, a group of pixels 210, 220, and 230, each of which receives light of a different color. Layer 260 is typically made of a low index of refraction material (including gasses and vacuums) and is disposed between layer 250 and refraction element 270. The faces of refraction element 270 are each selectively oriented to allow refraction (e.g., emission of refracted light) of, for example, red light into photodiode region 217, green light into photodiode region 227, and blue light into photodiode region 237. In another embodiment, visible light can be refracted into a first photodiode region, while infra-red light can be refracted into a second photodiode region.

The pixels of array 200 are typically arranged in a two-dimensional array such that an electronic image can be formed in response to incident light (280) being captured by a photodiode in each pixel. As shown in the example above, refraction element 270 is used to "de-multiplex" chromatic information contained in light ray 280. Light ray 280 is de-multiplexed into color components when light ray 280 enters through a first surface of refraction element 270 and exits through a second (e.g., opposing) surface of refraction element 270.

For example, light ray 280 traverses from a medium (such as air) having a first index of refraction into the refraction element 270 having a second index of refraction (that is typically more than the first index of refraction). Having left the refraction element 270, light ray 280 encounters layer 260 having a third index of refraction (that is typically higher than the second index of refraction). The separation layer 250 has a fourth index of refraction (that can be, for example, higher than the third index of refraction) so that light ray 280 can be further refracted (or "bent") into a pixel of a corresponding color. Light ray 280 is shown as being de-multiplexed into R, G, and B components, although other divisions and color ranges are possible.

As illustrated in FIG. 2, light ray 280 entering refraction element 270 at an oblique angle to a surface of the refraction element 270, with the light ray path defining an optical axis before entering the refraction element. The array 200 can be positioned at an angle (that is not perpendicular) to the optical axis of incident light such that light enters a first surface of refraction element 270 and exits a second surface of refraction element 270, thereby being refracted into different colors and being directed towards photodiode regions of different colored pixels.

Thus, the relative amounts of light captured by each subpixel can be selected by varying the thickness of separation layer 250, selecting the relative index of refraction of refraction element 270 (for example, with respect to the indices of refraction of surrounding materials), selecting the angles of the refracting surfaces of refraction element 270, and selecting the orientation of the refraction element 270 to incident light. The subpixels of array 200 can capture light more efficiently than pixels that use color filter arrays, because pixels that use color filter arrays operate by blocking light of non-desired colors (e.g., G and B) so that the blocked light is not absorbed by pixels for a desired color (e.g., R).

Figure 3:
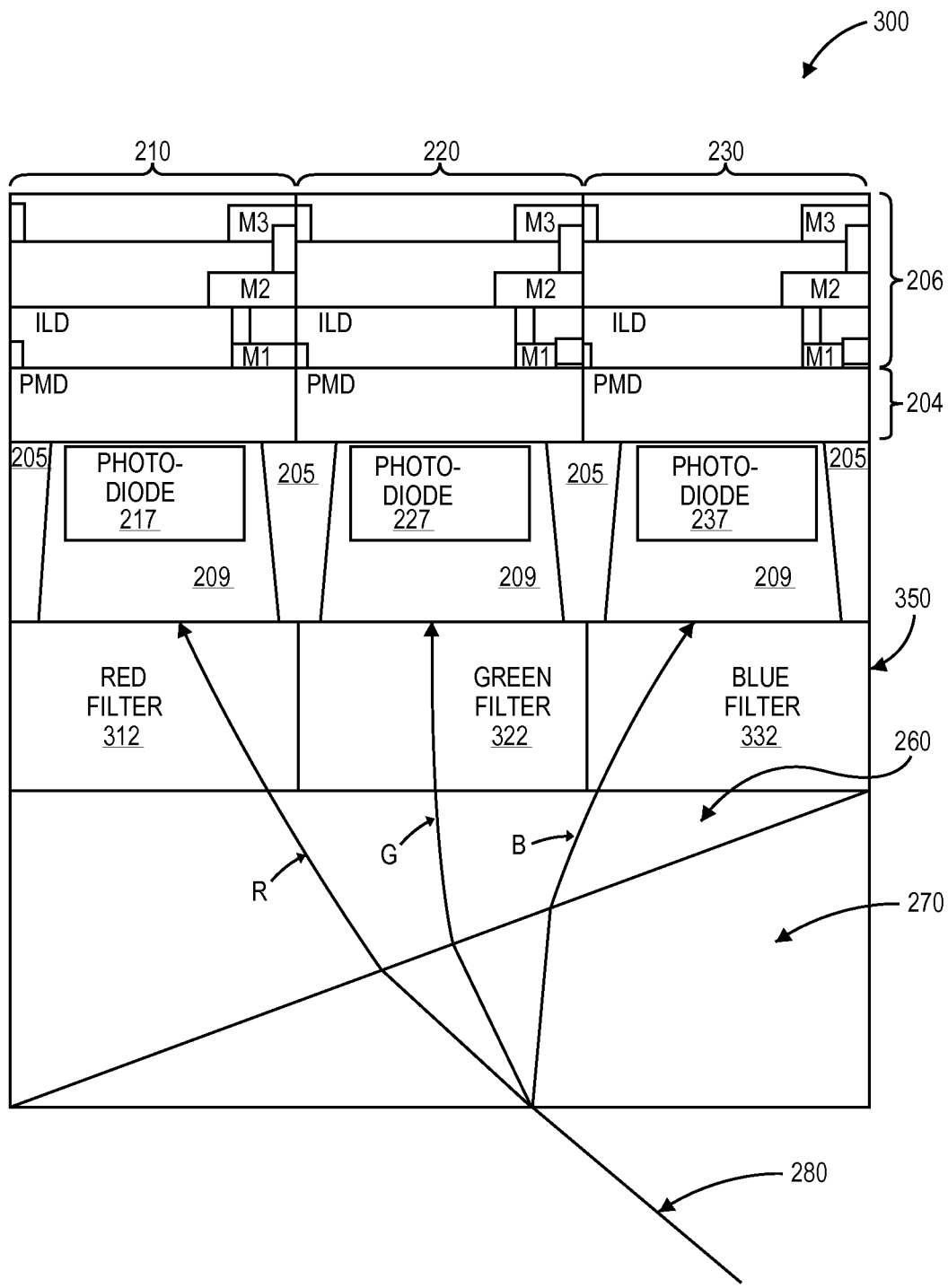
FIG. 3 is an illustration of a cross-section of a sample sensor array of backside illuminated (BSI) pixel of an image sensor having color filters.
Figure 4:
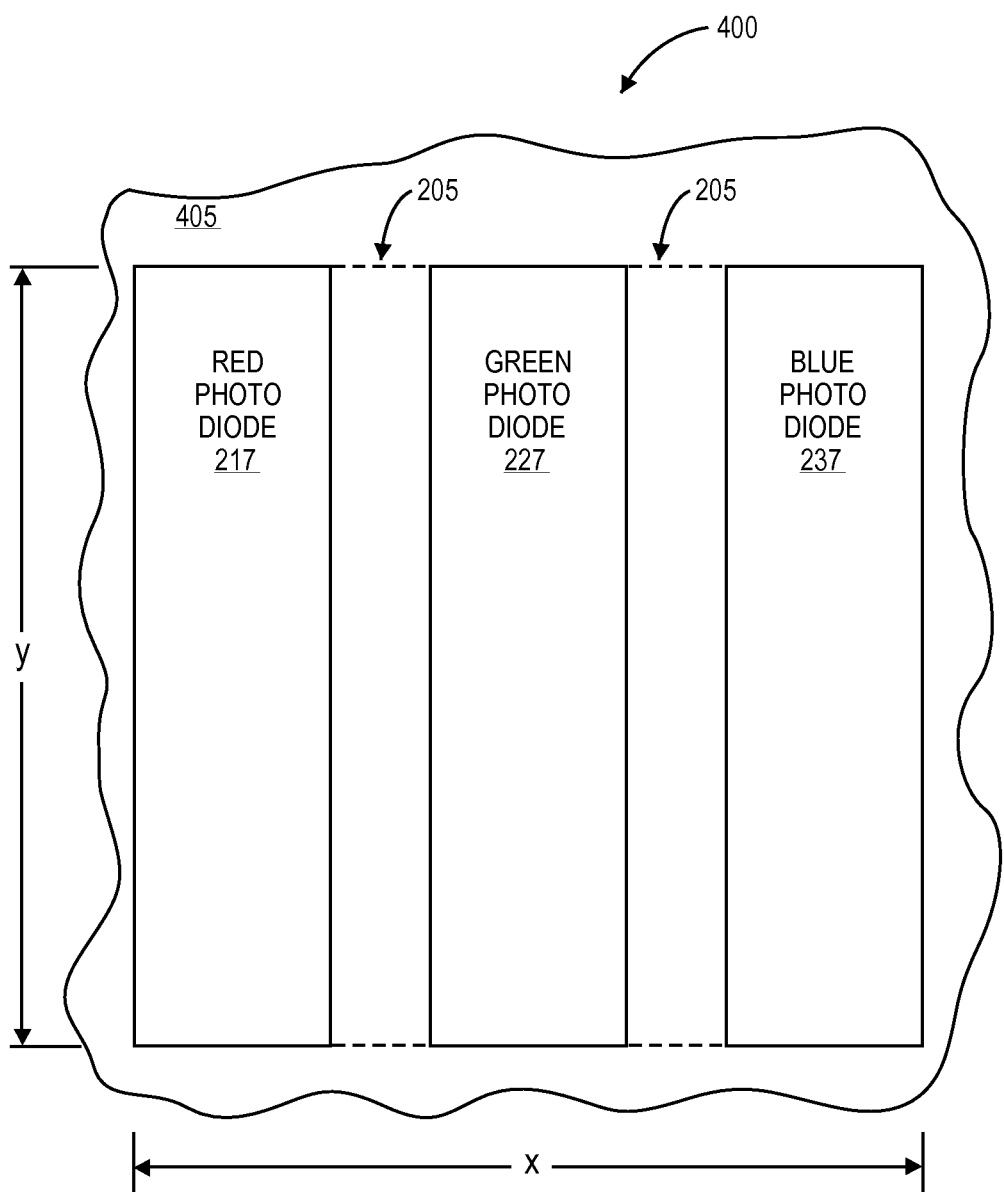
FIG. 4 illustrates a top view of a group of pixels used in an array, in accordance with an embodiment of the invention.

FIG. 3 is an illustration of a cross-section of a sample sensor array of backside illuminated (BSI) pixel of an image sensor having color filters. Array 300 includes pixels 210, 220, and 230. Structure 300 typically contains at least thousands of pixels and often contains more than a million pixels. Three subpixels are shown for the purpose of clarity. Each subpixel can be separated from other subpixels by, for example, a shallow-trench isolation (STI) structure 205.

Layer 350 can be formed under a substrate 209 and isolation regions 205. The thickness of layer 350 can be selected to allow dispersion of, for example, red light into photodiode region 217, green light into photodiode region 227, and blue light into photodiode region 237. Layer 350 can include red filter 312, green filter 322, and blue filter 332.

Refraction element 270 is disposed under layer 260, as discussed above. Refraction element 270 is typically oriented to allow dispersion of, for example, red light into photodiode region 217, green light into photodiode region 227, and blue light into photodiode region 237. As shown in the example above, refraction element 270 is used to "de-multiplex" chromatic information contained in light ray 280. Light ray 280 is de-multiplexed into color components when light ray 280 enters through a first surface of refraction element 270 and exits through a second (e.g., opposing) surface of refraction element 270. Light ray 280 is shown as being de-multiplexed into R, G, and B components, although other divisions are possible.

As illustrated in FIG. 3, light ray 280 entering refraction element 270 at an oblique angle to a surface of the refraction element 270, with the light ray path defining an optical axis before entering the refraction element. However, not all light rays that enter the refraction element have parallel (or the same) optical axes. Thus, not all light rays of identical color exit refraction element 270 at an identical angle, which can lead to a "blurring" of the output of the refraction element. The color filters act to reduce this blurring by typically passing light rays of desired colors into respective photodiode regions for individual colors (e.g., R, G, and B)

The color filters (e.g., 312, 322, and 332) do not absorb (e.g., "block") as much light as conventional pixel color filters that are exposed to "white light" (e.g., unfiltered, un-refracted light), because the refraction of the refraction element directs light of a selected color to a color filter of the selected color (which passes the selected color, and filters other colors). Thus the efficiency of the pixels is increased over conventional color filter arrays.

FIG. 4 illustrates a top view of a group of pixels used in an array, in accordance with an embodiment of the invention. Group 400 is one possible implementation of at least three different colored pixels (e.g., a triplet) for producing (for example) RGB information for a single display pixel of an electronic image captured by pixel array 105 shown in FIG. 1. The illustrated embodiment of group 400 shown in FIG. 4 includes a semiconductor layer (i.e., substrate 405), photodiode regions formed in substrate 405 for pixels of different colors (such as red photodiode 210, green photodiode 227, and blue photodiode 237), and isolation regions 205 formed in substrate 405 between photodiode regions. Isolation regions can be shallow trench isolation ("STI") trenches, for example.

The group 400 of pixels is disposed in pixel array 105 such that the group produces an image having a substantially square aspect ratio. An image array has a substantially square aspect ratio when an electronic image comprising the image pixels produces an image that appears to be square to the human vision system. The group can be arranged such that the height "y" of the footprint of the group is substantially equal to the length "x" of the footprint of the group (e.g., the groups can be disposed in pixel array 105 in a square grid pattern). Moreover, the footprint of each photodiode region of each pixel in a group typically has an aspect ratio that has a length in one dimension that is equal to or greater than twice the length in a second dimension. Further, each photodiode region in the group need not have the same dimensions (in either or both first and second dimensions) as other photodiode regions in the same group.

Figure 5:
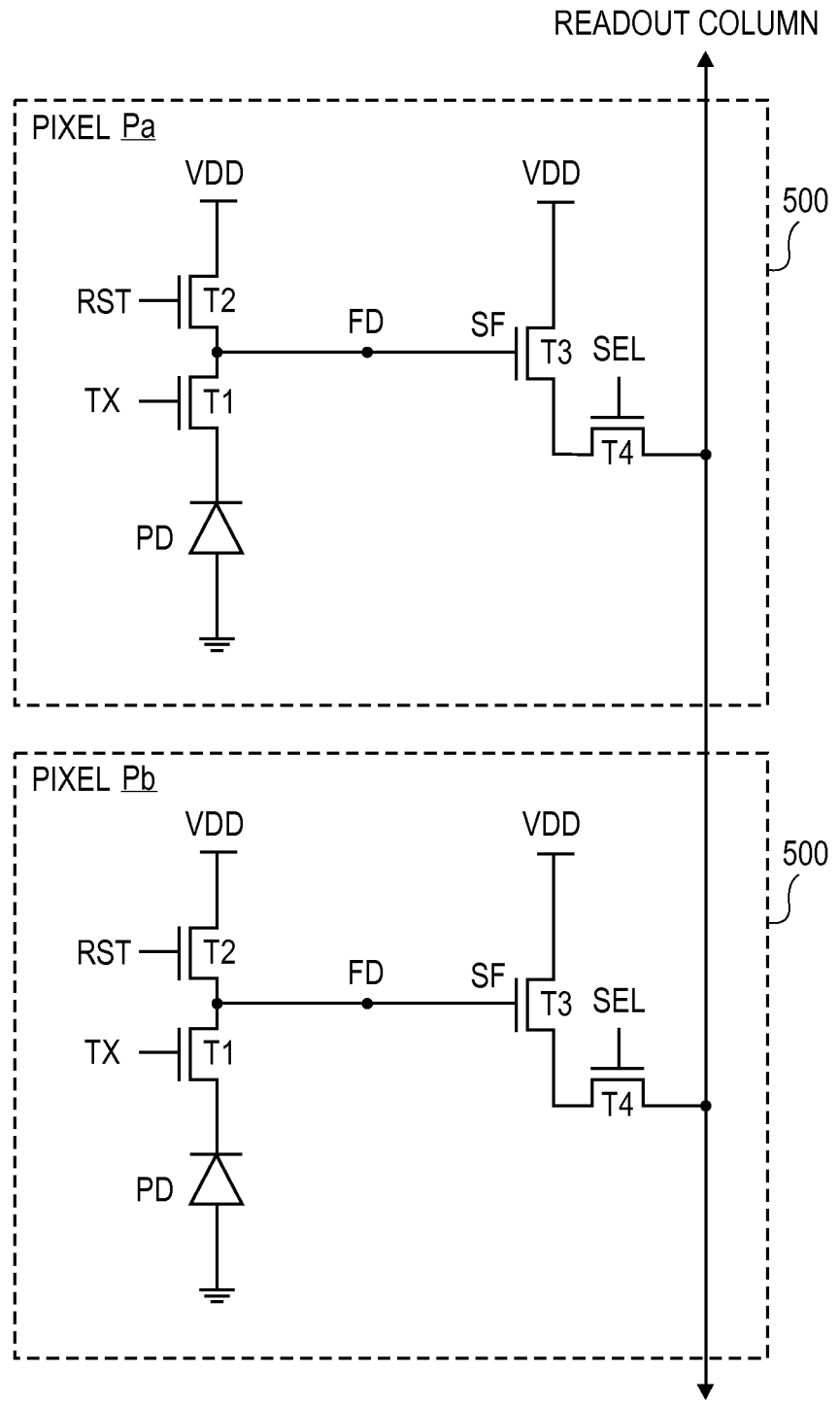
FIG. 5 is a circuit diagram illustrating pixel circuitry of two four-transistor ("4T") pixels within a backside illuminated imaging array, in accordance with an embodiment of the invention.

FIG. 5 is a circuit diagram illustrating pixel circuitry 500 of two four-transistor ("4T") pixels within a backside illuminated imaging array, in accordance with an embodiment of the invention. Pixel circuitry 500 is but one possible pixel circuitry architecture for implementing pixels within pixel array 105 of FIG. 1. However, it should be appreciated that embodiments of the present invention are not limited to 4T pixel architectures; but that 3T designs, 5T designs, and various other pixel architectures can be used.

In FIG. 5, pixels Pa and Pb are arranged in two rows and one column. The illustrated embodiment of each pixel circuitry 500 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD.

Reset transistor T2 is coupled between a power rail VDD and the floating diffusion node FD to reset (e.g., discharge or charge the FD to a preset voltage) under control of a reset signal RST. The floating diffusion node FD is coupled to the gate of SF transistor T3. SF transistor T3 is coupled between the power rail VDD and select transistor T4. SF transistor T3 operates as a source-follower providing a high impedance output from floating diffusion node FD. Finally, select transistor T4 selectively couples the output of pixel circuitry 500 to the readout column line under control of a select signal SEL. In one embodiment, the TX signal, the RST signal, and the SEL signal are generated by control circuitry 120. The TX signal, the RST signal, the SEL signal, VDD, and ground may be routed in pixel circuitry 500 by way of metal interconnect layers M1 and M2. In one embodiment, transistors T1, T2, T3, and T4, photodiode PD and floating diffusion node FD may be connected as shown in FIG. 5 by way of metal interconnect layers M1 and M2.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor, comprising:
a first imaging pixel for a first color having a photosensitive region disposed within a substrate of the image sensor;
a second imaging pixel for a second color that is different from the first color having a photosensitive region disposed within the substrate;
a third imaging pixel for a third color that is different from the first and second colors having a photosensitive region disposed within the substrate, wherein the first, second, and third imaging pixels are arranged in a single row, and wherein each of the first, second, and third imaging pixels has an individual footprint that is elongated such that collectively the first, second, and third imaging pixels have a collective footprint that is substantially square;
a prismatic refraction element disposed adjacent to the substrate to separate different colors of incident light towards different directions, the prismatic refraction element refracting light of the first color to the photosensitive region of the first imaging pixel, refracting light of the second color to the photosensitive region of the second imaging pixel, and refracting light of the third color to the photosensitive region of the third imaging pixel, wherein the prismatic refraction element de-multiplexes the incident light into the first, second, and third colors in directions extending along the single row including the first, second, and third imaging pixels; and
a layer disposed between the prismatic refraction element and the substrate, the layer having a thickness to permit light of the first color to spread towards the first imaging pixel without a first lens disposed between the prismatic refraction element and the first imaging pixel and to permit light of the second color to spread towards the second imaging pixel without a second lens disposed between the prismatic refraction element and the second imaging pixel,
wherein a portion of the prismatic refraction element that refracts the light that is directed to the first, second, and third imaging pixels also overlays the same first, second, and third imaging pixels,
wherein the layer is disposed on the substrate, supports the prismatic refraction element, and has an index of refraction higher than a refractive index of air.

2. The image sensor of claim 1, wherein the aspect ratio of the individual footprints of each of the photosensitive regions is greater than or equal to 2.

3. The image sensor of claim 1, wherein groups of the first, second, and third imaging pixels are arranged in a grid pattern that is square.

4. The image sensor of claim 1, wherein the layer includes a filter of the first color adjacent to the first imaging pixel, includes a filter of the second color adjacent to the second imaging pixel, and includes a filter of the third color adjacent to the third imaging pixel.

5. The image sensor of claim 1, wherein the prismatic refraction element has an index of refraction that is greater than or equal to 2.

6. The image sensor of claim 1, wherein the prismatic refraction element is disposed on a backside of the substrate, wherein the substrate is backside illuminated.

7. The image sensor of claim 1, wherein the first color is red, the second color is green, and the third color is blue.

8. The image sensor of claim 1, wherein the first color is visible light and the second color is infra-red light.

9. The image sensor of claim 1 wherein the prismatic refraction element comprises a first refractive layer disposed over the first, second, and third imaging pixels, wherein the image sensor further comprises:
    a second refractive layer disposed between the first refractive layer and the substrate,
    wherein an interface between the first and second refractive layers forms an oblique angle to the substrate,
    wherein the first refractive layer has a higher index of refraction than the second refractive layer.

10. The image sensor of claim 9, further comprising:
    a separation layer disposed between the second refraction layer and the substrate to provide a region for the different colors of the incident light to spread out towards the first, second, and third imaging pixels.

11. An imaging sensor comprising:
    a semiconductor layer having a front surface and a back surface;
    a first imaging pixel including a photodiode region formed within the semiconductor layer;
    a second imaging pixel including a photodiode region formed within the semiconductor layer;
    a third imaging pixel including a photodiode region formed within the semiconductor layer, wherein the first, second, and third imaging pixels are arranged in a single row of the imaging sensor, wherein each of the first, second, and third imaging pixels has an individual footprint that is elongated such that collectively the first, second, and third imaging pixels have a collective footprint that is substantially square;
    a separation layer of a first index of refraction formed on the back surface; and
    a prismatic refraction element of a second index of refraction that is higher than the first index of refraction, the prismatic refraction element disposed under the separation layer such that the prismatic refraction element refracts red light towards the photodiode region of the first imaging pixel, refracts green light towards the photodiode region of the second imaging pixel, and refracts blue light towards the photodiode region of the third imaging pixel, wherein the prismatic refraction element de-multiplexes the incident light into the red, green, and blue light in directions extending along the single row including the first, second, and third imaging pixels,
    wherein the separation layer permits the red light, the green light, and the blue light to spread out towards the photodiode regions of the first, second, and third imaging pixels, respectively, without including lenses disposed within the separation layer to focus the red, green, or blue light,
    wherein a portion of the prismatic refraction element that refracts light that is directed to the first, second, and third imaging pixels also overlays the same first, second, and third imaging pixels,
    wherein the prismatic refraction element is disposed on the separation layer and the separation layer is disposed on the substrate and the separation layer supports the prismatic refraction element,
    wherein the separation layer has an index of refraction higher than a refractive index of air.

12. The imaging sensor of claim 11, wherein each imaging pixel further includes:
    a floating diffusion region formed within the semiconductor layer; and
    a transfer gate coupled between the photodiode and the floating diffusion region.

13. The imaging sensor of claim 11, wherein each imaging pixel is a complementary metal-oxide-semiconductor ("CMOS") imaging pixel.

14. The imaging sensor of claim 11, wherein each imaging pixel is a backside illuminated imaging pixel.

* * * * *